United States Patent
Rim

(10) Patent No.: US 7,812,658 B2
(45) Date of Patent: Oct. 12, 2010

(54) CLOCK GENERATION CIRCUIT

(75) Inventor: Woo-Jin Rim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 11 days.

(21) Appl. No.: 12/346,814

(22) Filed: Dec. 30, 2008

(65) Prior Publication Data

US 2010/0052749 A1    Mar. 4, 2010

(30) Foreign Application Priority Data

Aug. 29, 2008    (KR) .................. 10-2008-0085377

(51) Int. Cl.
H03L 7/06    (2006.01)
(52) U.S. Cl. ...................... 327/158; 327/149
(58) Field of Classification Search .............. 327/149, 327/158
See application file for complete search history.

(56) References Cited

U.S. PATENT DOCUMENTS

| | | | |
|---|---|---|---|
| 5,955,902 A * | 9/1999 | Takada et al. ............. 327/116 |
| 6,005,420 A * | 12/1999 | Yoshizawa et al. ......... 327/116 |
| 7,180,340 B2 | 2/2007 | Jung et al. |
| 7,271,631 B2 | 9/2007 | Watanabe et al. |
| 7,292,079 B2 | 11/2007 | Huang et al. |
| 7,339,364 B2 * | 3/2008 | Kam et al. ............... 324/76.54 |
| 2007/0030041 A1 * | 2/2007 | Huang et al. ............... 327/158 |
| 2009/0128201 A1 * | 5/2009 | Chen et al. ................ 327/149 |
| 2010/0120389 A1 * | 5/2010 | Blum ........................ 455/208 |

OTHER PUBLICATIONS

"A Low-Power Small-Area ±7.28-ps-Jitter 1-GHz DLL-Based Clock Generator"; Chulwoo Kim et al., IEEE, vol. 37, No. 11, Nov. 11, 2002.

* cited by examiner

Primary Examiner—Lincoln Donovan
Assistant Examiner—Adam D Houston
(74) Attorney, Agent, or Firm—IP & T Law Firm PLC

(57) ABSTRACT

A clock generation circuit, which includes a reference clock delay circuit including a number M of delay units connected in series, and configured to delay a reference clock by L cycles; and an oscillation circuit including a number N of delay units connected in series, and configured to generate an oscillation clock according to the following Equation, $$tOS = 2N \times DD = 2N \times L \times \frac{tCLK}{M}$$

where each delay unit is configured to delay an input signal by a reference delay amount DD, tOS is a period of the oscillation clock, and tCLK is the reference clock.

18 Claims, 5 Drawing Sheets

CLOCK GENERATION CIRCUIT
>
> ## CROSS-REFERENCE TO RELATED APPLICATIONS
>
> The present invention claims priority of Korean patent application number 10-2008-0085377, filed on Aug. 29, 2008, which is incorporated by reference in its entirety.
>
> ## BACKGROUND OF THE INVENTION
>
> The present invention relates to a clock generation circuit, and more particularly, to a clock generation circuit configured to generate a frequency-divided clock using a delay locked loop (DLL) circuit.
>
> Various clock generation circuits are used to supply a clock signal with a predetermined frequency to a system. A high clock frequency is difficult to be directly realized by a clock generation circuit. Therefore, a clock generation circuit that multiplies a frequency of a low frequency clock to generate a high frequency clock is employed to generate a clock having the predetermined frequency. In general, the clock generation circuit including a delay locked loop (DLL) circuit combined with an edge combination unit is being used to multiply the frequency of the clock.
>
> FIG. 1 illustrates a conventional clock generation circuit.
>
> Referring to FIG. 1, the conventional clock generation circuit includes a phase control unit 101, a voltage control delay unit 107, and an edge combination unit 109. The phase control unit 101 includes a phase comparison unit 103 and a delay control unit 105.
>
> The phase comparison unit 103 compares the phase of a delay clock CLKD_M fed back from the voltage control delay unit 107 with the phase of a reference clock CLK, to thereby output a comparison signal CMP, which contains information on the phase difference between the reference clock CLK and the delay clock CLKD_M, to the delay control unit 105.
>
> The delay control unit 105 outputs a delay signal VCTRL, which controls a reference delay amount (see DD in FIG. 2), to the voltage control delay unit 107 in response to the comparison signal CMP outputted from the phase comparison unit 103.
>
> The voltage control delay unit 107 includes a plurality of delay units, e.g., M number of delay units, which are connected in series. The voltage control delay unit 107 delays the reference clock CLK and the output signal of each delay unit by the reference delay amount DD in response to the delay control signal VCTRL generated by the delay control unit 105, thereby outputting first to Mth delay clocks CLKD_1 to CLKD_M. The first to Mth delay clocks CLKD_1 to CLKD_M outputted from the delay control unit 105 also are respectively inputted to the edge combination unit 109. Therefore, the reference clock CLK is delayed by the reference delay amount DD whenever it passes through the delay units of the voltage control delay unit 107. A total delay amount of the voltage control delay unit 107 corresponds to L cycles of the reference clock CLK, that is, M×DD=L×tCLK (where M and L are natural numbers), where tCLK denotes one cycle of the reference clock CLK. Accordingly, the Mth delay clock CLKD_M outputted from the last delay unit is in phase with the reference clock CLK.
>
> The first to Mth delay clocks CLKD_1 to CLKD_M are inputted to the edge combination unit 109. The edge combination unit 109 generates a clock toggling in response to the rising or falling edge of each of the first to Mth delay clocks CLKD_1 to CLKD_M, thereby multiplying a frequency of the reference clock CLK. Operation of the edge combination unit 109 will be more fully described with reference to FIG. 2.
>
> FIG. 2 is a timing diagram illustrating the operation of the edge combination unit 109. To facilitate understanding, description will be made on one exemplary case where the voltage control delay unit 107 generates first to fourth delay clocks CLKD_1 to CLKD_4, and the total delay amount given by the voltage control delay unit 107 is one cycle (tCLK) of the reference clock CLK, i.e., L=1.
>
> The fourth delay clock CLKD_4 is in phase with the reference clock CLK, and the reference delay amount DD of each delay unit of the voltage control delay unit 107 is equal to a quarter of a period of the reference clock CLK.
>
> FIG. 2 exemplarily illustrates that the edge combination unit 109 generates a clock toggling in response to rising edges of the first to fourth delay clocks CLKD_1 to CLKD_4.
>
> The output clock CLK_OUT of the edge combination unit 109 is activated to a logic high level in synchronization with the rising edges of the first and third delay clocks CLKD_1 and CLKD_3 and is deactivated to a logic low level in synchronization with the second and fourth delay clocks CLKD_2 and CLKD_4. The period of the output clock CLK_OUT of the edge combination unit 109 is half of the period of the reference clock CLK (i.e. 2DD), and thus the frequency of the output clock CLK_OUT of the edge combination unit 109 is two times the frequency of the reference clock CLK. Thus, the edge combination unit 109 multiplies the frequency of the reference clock CLK of the edge combination unit 109 by two. As the number of delay clocks becomes larger, the edge combination unit 109 can multiply the frequency of the reference clock CLK by a higher multiplication ratio.
>
> Meanwhile, a phase mixing unit (not shown in FIG. 1) may be used besides the edge combination unit 109, and the phase mixing unit multiplies the frequency of an input clock by mixing phases of a plurality of delay clocks.
>
> However, the conventional clock generation circuit is disadvantageous in that the edge combination unit 109 and the phase mixing unit have such complicated circuit configurations that a malfunction may occur during frequency multiplication. Moreover, in a conventional clock generation circuit, the layout area required for the clock generation circuit should be great due to the circuit configurations of the edge combination unit 109 and the phase mixing unit.
>
> ## SUMMARY OF THE INVENTION
>
> Embodiments of the present invention are directed to providing a clock generation circuit that can prevent a malfunction and reduce an occupation area.
>
> In accordance with an aspect of the invention, there is provided a clock generation circuit, which includes a reference clock delay circuit including M number of delay units connected in series, and configured to delay a reference clock by L cycles, the delay unit configured to delay an input signal by a reference delay amount; and an oscillation circuit including N number of the delay units connected in series, and configured to generate an oscillation clock expressed as the following Equation
>
> $$tOS = 2N \times DD = 2N \times L \times \frac{tCLK}{M}$$
>
> where tOS is a period of the oscillation clock, DD is the reference delay amount, and tCLK is the reference clock.

In accordance with another aspect of the invention, there is provided a clock generation circuit, which includes a phase comparison unit configured to compare a phase of a delay clock with a phase of a reference clock to generate a comparison signal; a delay control unit configured to output a delay signal controlling a reference delay amount in response to the comparison signal; a voltage control delay unit configured to delay the reference clock by M times the reference delay amount in response to the delay signal; and an oscillation unit including series-connected N number of delay units through which delay amounts are respectively controlled in response to the delay signal, wherein an output signal of the last delay unit of the N number of delay units is inverted and inputted to the first delay unit of the N number of delay units.

In accordance with another aspect of the invention, there is provided a clock generation circuit, which includes a phase comparison unit configured to compare the phase of a delay clock with the phase of a reference clock to generate a comparison signal; a delay control unit configured to output a delay signal controlling the reference delay amount in response to the comparison signal; a voltage control delay unit configured to delay the reference clock by M times the reference delay amount in response to the delay signal, where the M is an even number; and an oscillation circuit including serially-connected N number of delay units through which the reference delay amounts are respectively controlled in response to the delay signal, wherein an output signal of the last delay unit of the N number of delay units is inverted and inputted to the first delay unit of the N number of delay units, where the N is an odd number, each of the delay units being configured to invert and output an input signal.

In accordance with another aspect of the invention, there is provided a clock generation circuit, which includes a delay lock circuit configured to delay a reference clock to generate M number of delay clocks, a delay between two consecutive clocks being equal to a reference delay amount; and an oscillation circuit configured to generate an oscillation clock oscillating at a frequency inversely proportional to the reference delay amount, wherein the oscillation clock is inverted and fed back to the oscillation circuit.

DESCRIPTION OF SPECIFIC EMBODIMENTS

Other objects and advantages of the present invention can be understood by the following description, and become apparent with reference to the embodiments of the invention.

Figure 3:
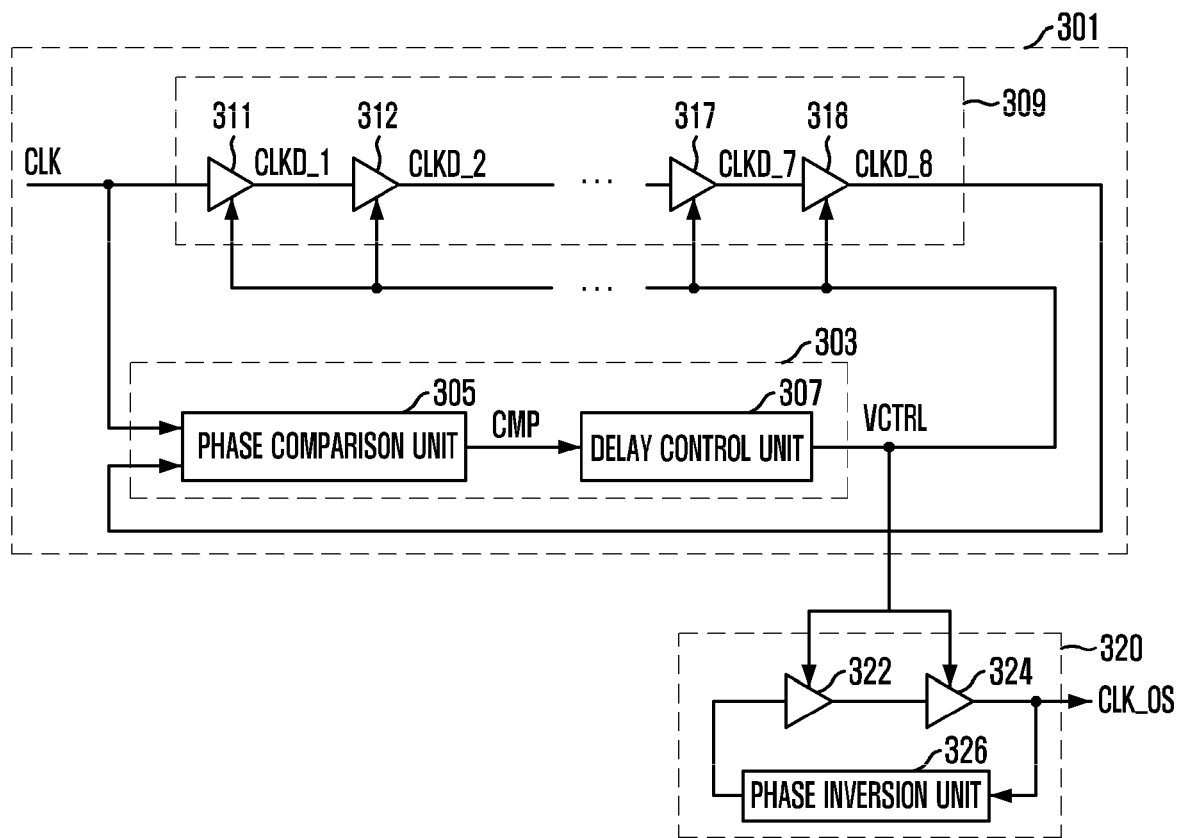
FIG. 3 illustrates a clock generation circuit in accordance with an embodiment of the present invention.

FIG. 3 illustrates a clock generation circuit in accordance with an embodiment of the invention.

Referring to FIG. 3, a clock generation circuit in accordance with the invention includes a delay lock circuit 301 and an oscillation circuit 320.

Figure 1:
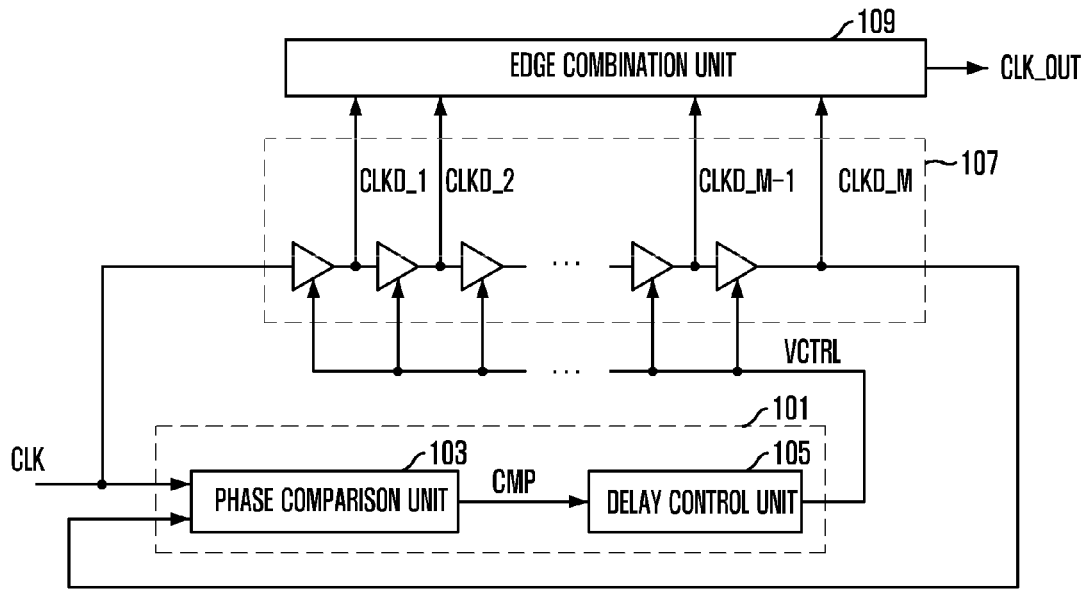
FIG. 1 illustrates a conventional clock generation circuit.
Figure 2:
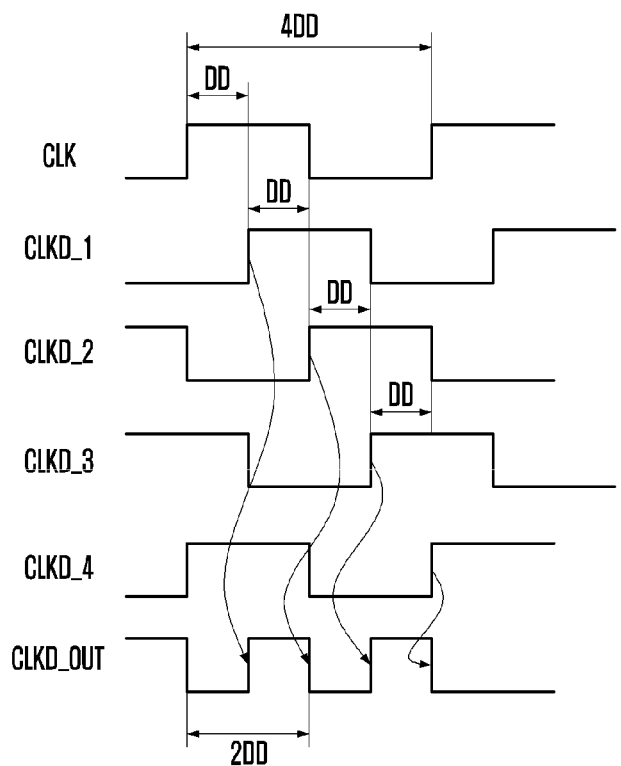
FIG. 2 is a timing diagram illustrating the operation of an edge combination unit.

The clock generation circuit in accordance with the invention is similar to the conventional clock generation circuit of FIG. 1 in that it is based on a delay lock loop (DLL) circuit. However, the clock generation circuit in accordance with the invention employs an oscillation circuit 320 instead of the edge combination unit (see 109 in FIG. 1), which significantly differs from the conventional clock generation circuit of FIG. 1.

Similar to the configuration of a conventional DLL circuit, the delay lock circuit 301 includes a phase control unit 303 and a voltage control delay unit 309. The delay lock circuit 301 delays a reference clock CLK to generate a plurality of delay clocks. Herein, the delay between two consecutive delay clocks is equal to a reference delay amount DD.

The voltage control delay unit 309 includes a plurality of delay units connected in series. The delay unit delays the reference clock CLK and the output signal of each delay unit by the reference delay amount DD, and then outputs the delay clock. The reference clock CLK is delayed by the reference delay amount DD whenever it passes through a delay unit of the voltage control delay unit 309. Here, the total delay amount of the voltage control delay unit 309 corresponds to L cycles of the reference clock CLK, that is, M×DD=L×tCLK (where M and L are natural numbers, and tCLK denotes one cycle of the reference clock CLK). Accordingly, the Mth delay clock CLKD_M outputted from the last delay unit is in phase with the reference clock CLK. FIG. 3 exemplarily illustrates that the voltage control delay unit 309 includes eight delay units (i.e., M=8), and the total delay amount due to the voltage control delay unit 309 is one cycle (i.e., L=1) of the reference clock CLK. Therefore, the voltage control delay unit 309 illustrated in FIG. 3 generates the first to eighth delay clocks CLKD_1 to CLKD_8.

The oscillation circuit includes N number of delay units and a phase inversion unit 326. The N number of delay units is disposed on a forward path, and the phase inversion unit 326 is disposed on a feedback path. An oscillation clock CLK_OS, which is outputted from the oscillation circuit 320, is inverted and fed back by the phase inversion unit 326. The delay unit of the oscillation circuit 320 is identical in delay characteristic to the delay unit of the delay lock circuit 301. Accordingly, the oscillation clock CLK_OS outputted from the oscillation circuit 320 toggles corresponding to a delay amount (N×DD) proportional to the number (N) of the delay units included in the oscillation circuit 320, and therefore, the period (tOS) of the oscillation clock CLK_OS is 2N×DD. In the embodiment of FIG. 3, it is exemplarily illustrated that the oscillation circuit 320 includes two delay units, i.e., N=2.

In the result, the relation between the oscillation clock CLK_OS and the reference clock CLK may be expressed as the following Equation 1, $$tOS = 2N \times DD = 2N \times L \times \frac{tCLK}{M} \qquad \text{Eq. 1}$$

where N and M are natural numbers.

According to the above Equation 1, the period (tOS) of the oscillation clock CLK_OS can be controlled by the number (N) of the delay units included in the oscillation circuit 320, and the number (M) of the delay units included in the voltage control delay unit 309. This makes it possible to generate the oscillation clock CLK_OS of which a frequency is predetermined by the number of times (i.e., M/(2N)) the frequency of the reference clock CLK.

The phase control unit 303 includes a phase comparison unit 305 and a delay control unit 307. The phase comparison unit 305 compares a phase of the eighth delay clock CLKD_8 fed back from the voltage control delay unit 309 with a phase of the reference clock CLK to thereby output a comparison signal CMP having information on the phase difference between the reference clock CLK and the eighth delay clock CLKD_8.

The delay control unit 307 may include a charge pump and a loop filter. The charge pump of the delay control unit 307 is responsive to the comparison signal CMP outputted from the phase comparison unit 305 to thereby generate the delay signal VCTRL controlling delay amounts of the first to eighth delay clocks CLKD_1 to CLKD_8, that is, the reference delay amount DD. The loop filter removes a noise from the delay signal VCTRL, and outputs the noise-removed delay signal VCTRL to the voltage control delay unit 309.

The voltage control delay unit 309 includes first to eighth delay units 311 to 318, which are connected in series. The first to eighth delay units 311 to 318 respectively delay the reference clock CLK or the output signals of the preceding delay units by the reference delay amount DD in response to the delay signal VCTRL, thereby outputting the first to eighth delay clocks CLKD_1 and CLKD_8. The first to seventh delay clocks CLKD_1 to CLKD_7 outputted from the preceding delay units are inputted to the following delay units, respectively, and the eighth delay clock CLKD_8 is inputted to the phase comparison unit 305. Therefore, the reference clock CLK is delayed by the reference delay amount DD whenever it passes through the delay units 311 to 318 of the voltage control delay unit 309. Here, the total delay amount of the voltage control delay unit 309 corresponds to one cycle (tCLK) of the reference clock CLK, that is, 8×DD=tCLK. Accordingly, the eighth delay clock CLKD_8 outputted from the last delay unit is in phase with the reference clock CLK.

The oscillation circuit 320 includes the ninth and tenth delay units 322 and 324 having the same delay characteristics as the delay units 311 to 318 of the voltage control delay unit 309. In a similar manner as the first to eight delay units 311 to 318, each of the ninth and tenth delay units 322 and 324 delays an input signal by the reference delay amount DD in response to the delay signal VCTRL. The oscillation clock CLK_OS outputted from the tenth delay unit 324 is inverted by the phase inversion unit 326 and then fed back to the ninth delay unit 322. Hence, the period (tOS=2×N×DD) of the oscillation clock CLK_OS is 4DD (i.e., 2×2×DD).

Consequently, in accordance with the embodiment of FIG. 3, it can be appreciated that the period of the reference clock CLK and the period of the oscillation clock CLK_OS are 1/(8DD) and 1/(4DD), respectively, and thus the frequency of the oscillation clock CLK_OS is two times the frequency of the reference clock CLK.

In summary, the oscillation circuit 320 has a ring-oscillator configuration including at least one delay unit, and can multiply the frequency of the reference clock CLK through a simple configuration in accordance with the invention. Therefore, compared to the conventional clock generation circuit, the clock generation circuit of the invention is advantages in that it is possible to prevent a malfunction and reduce a layout area required for the clock generation circuit as well.

Meanwhile, from the above Equation, the frequency of the oscillation clock CLK_OS equals the frequency of the reference clock CLK if M equals 2N×L; and the frequency of the oscillation clock CLK_OS is smaller than the frequency of the reference clock CLK if M is smaller than 2N×L. However, the frequency of the oscillation clock CLK_OS is greater than the frequency of the reference clock CLK if M exceeds 2N×L, which is the same as the embodiment of FIG. 3.

Figure 4:
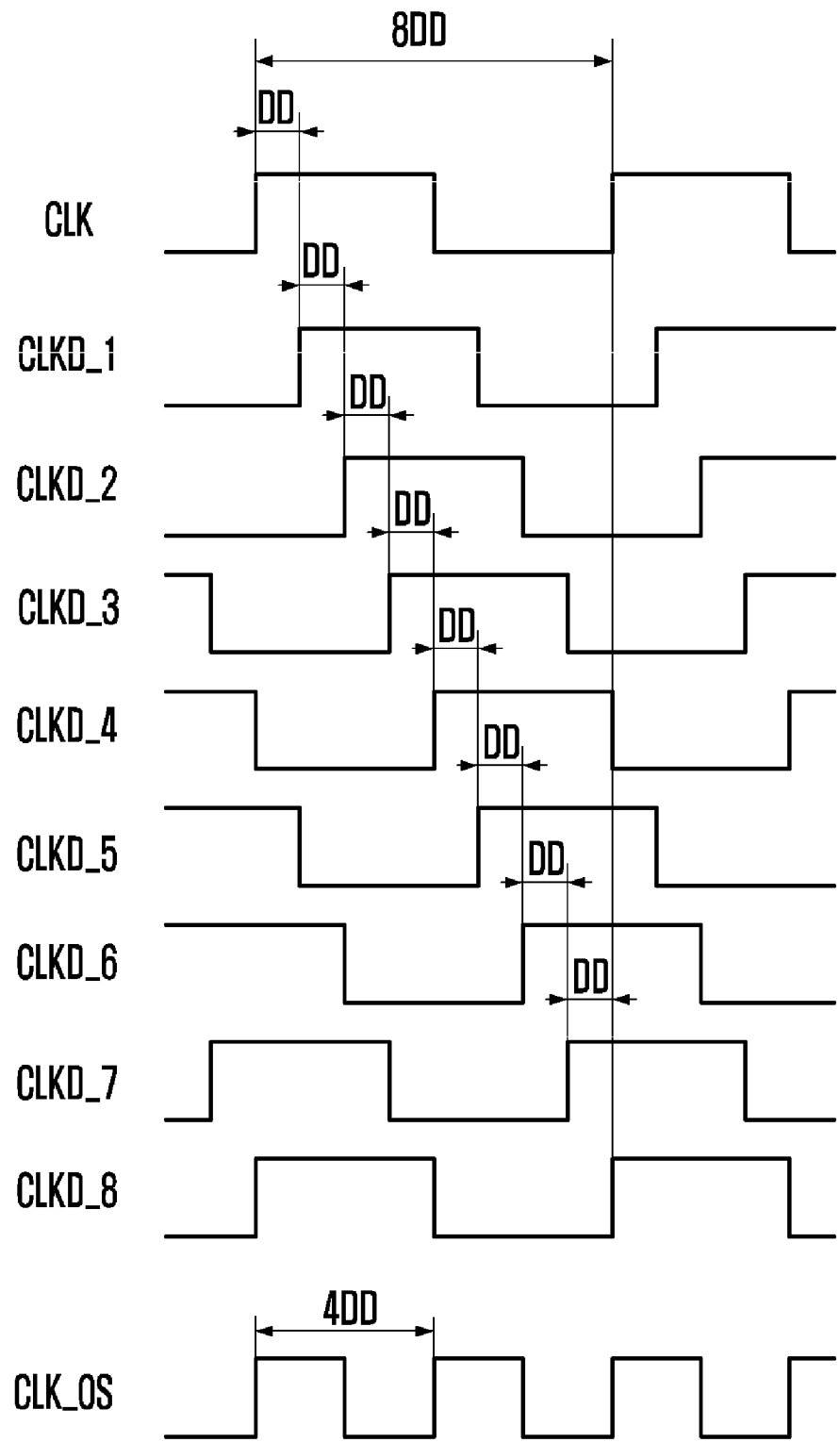
FIG. 4 is a timing diagram illustrating the operation of the clock generation circuit of FIG. 3.

FIG. 4 is a timing diagram illustrating the operation of the clock generation circuit of FIG. 3.

To set the reference delay amount DD to ⅛ of the period of the reference clock CLK, that is, DD=tCLK/M=tCLK/8, the voltage control delay unit 309 in FIG. 3 includes eight number of delay units 311 to 318. Accordingly, as illustrated in FIG. 4, the delay units of the voltage control delay unit 309 delay the reference clock CLK or output signals of the preceding delay units by the reference delay amount DD, respectively, to generate the first to eighth delay clocks CLKD_1 to CLKD_8.

The oscillation circuit 320 includes two delay units 322 and 324, and the period (tOS) of the oscillation clock CLK_OS is four times the reference delay amount DD, i.e., 4DD (2×2×DD). Therefore, the frequency of the oscillation clock CLK_OS is multiplied such that it is two times the frequency of the reference clock CLK.

Figure 5:
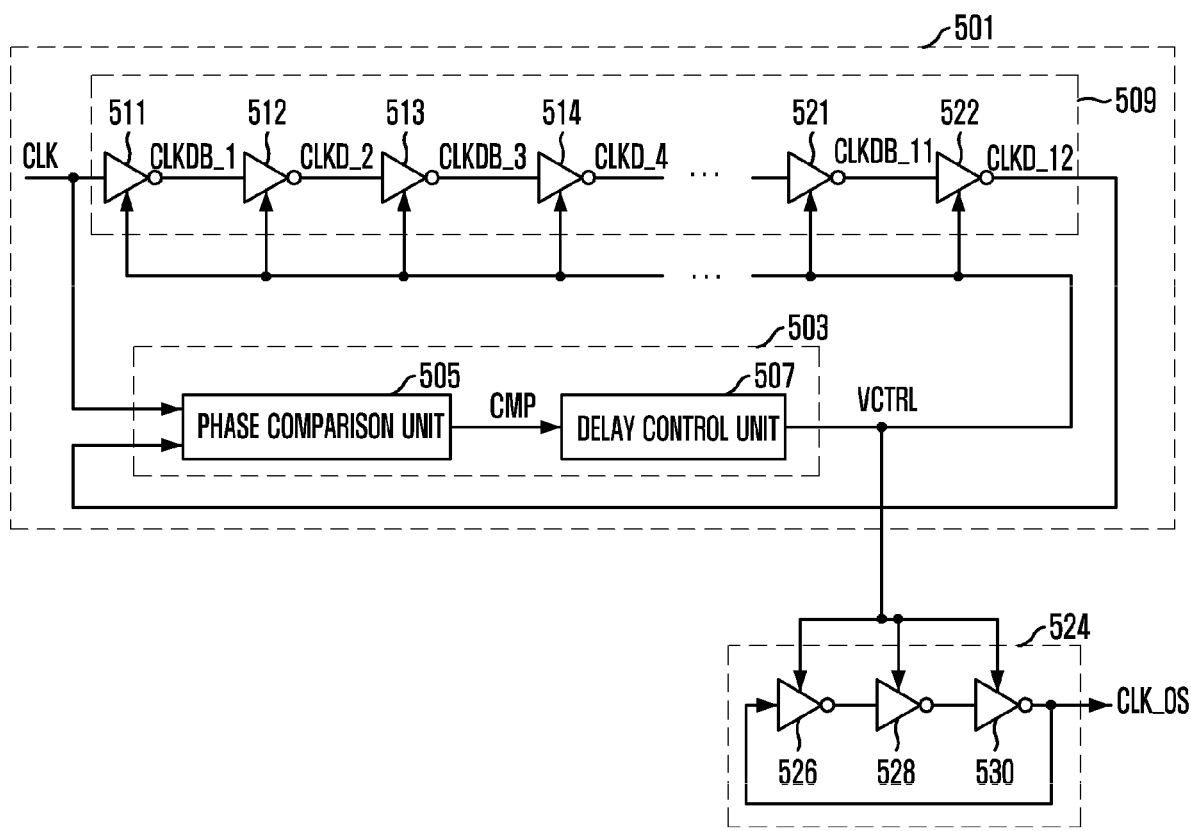
FIG. 5 illustrates a clock generation circuit in accordance with another embodiment of the invention.

FIG. 5 illustrates a clock generation circuit in accordance with another embodiment of the invention.

In a similar manner to the clock generation circuit of FIG. 3, a clock generation circuit in accordance with the embodiment of FIG. 5 includes a delay lock circuit 501 and an oscillation circuit 524. The delay lock circuit 501 includes a phase control unit 503 and a voltage control delay unit 509 like the delay lock circuit of the previous embodiment (see 301 of FIG. 3). The phase control unit 503 includes a phase comparison unit 505 and a delay control unit 507. However, unlike the clock generation circuit of FIG. 3, the clock generation circuit in accordance with the embodiment of FIG. 5 includes inversion delay units connected in series.

Consequently, the oscillation circuit 524 can oscillate the oscillation clock CLK_OS although the oscillation clock CLK_OS is not inverted and fed back. However, to invert the phase of the final output of the oscillation circuit 524, the oscillation circuit 524 may include an odd number of the inversion delay units.

In the clock generation circuit in accordance with this embodiment illustrated in FIG. 5, the voltage control delay unit 509 includes twelve inversion delay units (M=12), the oscillation circuit 524 includes three inversion delay units (N=3), and a total delay amount of the voltage control delay unit 509 is one cycle (L=1) of the reference clock CLK.

The voltage control delay unit 509 includes first to twelfth delay units 511 to 522 that are connected in series. The first to twelfth delay units 511 to 522 delay the reference clock CLK or the output signals of the preceding delay units by the reference delay amounts DD, respectively, in response to the delay signal VCTRL, so that it outputs twelve delay clocks, i.e., alternately positive and negative delay clocks CLKDB_1, CLKD_2, CLKDB_3, CLKD_4, CLKDB_5, CLKD_6, CLKDB_7, CLKD_8, CLKDB_9, CLKD_10, CLKDB_11, and CLKD_12.

The delay clocks CLKDB_1, CLKD_2, CLKDB_3, CLKD_4, CLKDB_5, CLKD_6, CLKDB_7, CLKD_8, CLKDB_9, CLKD_10, and CLKDB_11 are respectively inputted to the following delay units, and the delay clock CLKD_12 is inputted to the phase comparison unit 505. Therefore, the reference clock CLK is delayed by the reference delay amount DD whenever it passes through the inversion delay units of the voltage control delay unit 509. However, due to the characteristics of the inversion delay unit, the odd-numbered inversion delay unit inverts an input signal to output the delay clocks CLKDB_1, CLKDB_3, CLKDB_5, CLKDB_7, CLKDB_9, and CLKDB_11.

A total delay amount of the voltage control delay unit 509 corresponds to one cycle (tCLK) of the reference clock CLK, that is, 12×DD=tCLK. Accordingly, the twelfth delay clock CLKD_12 outputted from the last inversion delay unit is in phase with the reference clock CLK.

The oscillation circuit 524 includes three inversion delay units 526, 528, and 530 having the same delay characteristics as the inversion delay units 511 to 522 of the voltage control delay unit 509. Each of the thirteenth to fifteenth delay units 526, 528, and 530 delays their input signal by the reference delay amount DD in response to the delay signal VCTRL, like the first to twelfth delay units 511 and 522. The oscillation clock CLK_OS outputted from the fifteenth delay unit 530, which is an odd-numbered inversion delay unit, is fed back to the ninth delay unit 526. Therefore, the period (tOS=2×3× DD) of the oscillation clock CLK_OS is 6DD.

Since the period is in inverse proportion to the frequency, it can be appreciated that the frequency of the reference clock CLK and the frequency of the oscillation clock CLK_OS are 1/(12DD) and 1/(6DD), respectively, and thus the frequency of the oscillation clock CLK_OS is two times the frequency of the reference clock CLK.

Figure 6:
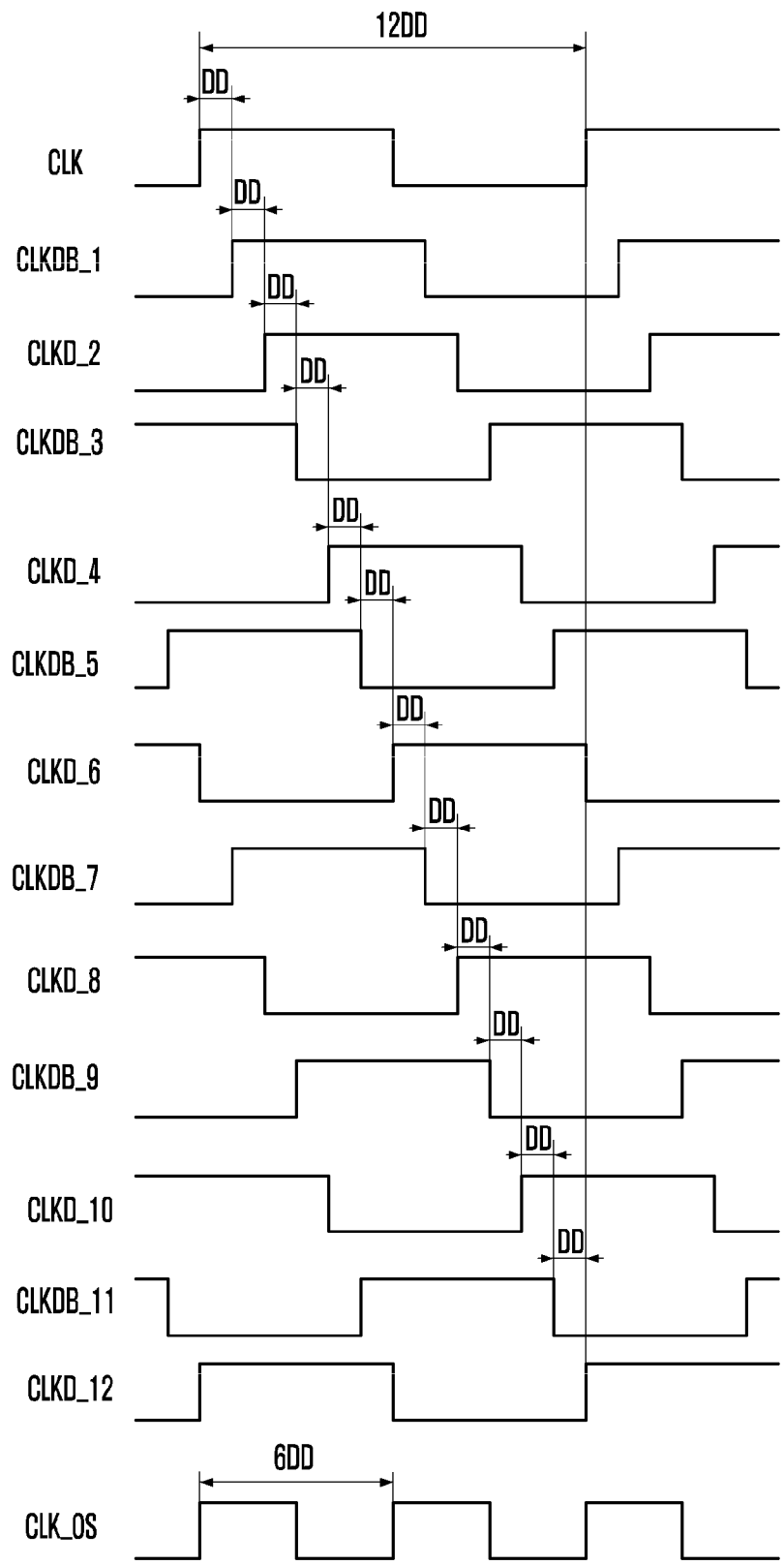
FIG. 6 is a timing diagram illustrating the operation of the clock generation circuit of FIG. 5.

FIG. 6 is a timing diagram illustrating the operation of the clock generation circuit of FIG. 5.

To set the reference delay amount DD to 1/12 of the period of the reference clock CLK, that is, DD=tCLK/M=tCLK/12, the voltage control delay unit 509 includes twelve number of inversion delay units 511 to 522. Accordingly, as illustrated in FIG. 6, the delay units of the voltage control delay unit 509 delay the reference clock CLK or output signals of the preceding delay units by the reference delay amount DD, respectively, to thereby generate the first to twelfth delay clocks CLKD_1 to CLKD_12. As described above, the odd-numbered inversion delay units invert the input signals to output the delay clocks CLKDB_1, CLKDB_3, CLKDB_5, CLKDB_7, CLKDB_9, and CLKDB_11.

The oscillation circuit 524 includes three delay units 526, 528, and 530, and the period of the oscillation clock CLK_OS is six times the reference delay amount DD, i.e., 6DD (2×3× DD). Thus, the frequency of the oscillation clock CLK_OS is multiplied such that it is two times the frequency of the reference clock CLK.

In accordance with the invention, it is possible to prevent the malfunction of a clock generation circuit and reduce the layout area required for the clock generation circuit by multiplying the frequency of a reference clock using an oscillator having a simple circuit configuration.

While the invention has been described with respect to the specific embodiments, it will be apparent to those skilled in the art that various changes and modifications may be made without departing from the spirit and scope of the invention as defined in the following claims.

What is claimed is:

1. A clock generation circuit, comprising:
   a reference clock delay circuit including a first set of M delay units connected in series, and configured to delay a reference clock by L cycles; and
   an oscillation circuit including a second set of N delay units connected in series, and configured to generate an oscillation clock according to the following Equation, $$tOS = 2N \times DD = 2N \times L \times \frac{tCLK}{M}$$

wherein each delay unit in the first and second sets is configured to delay an input signal by a reference delay amount DD, tOS is a period of the oscillation clock, and tCLK is the reference clock.

2. The clock generation circuit of claim 1, wherein the oscillation circuit further includes a phase inversion unit configured to invert a phase of the oscillation clock and to feedback the phase-inverted oscillation clock.

3. The clock generation circuit of claim 1, wherein each delay unit includes an inversion delay unit, and the N is an odd number.

4. The clock generation circuit of claim 1, further comprising a phase control unit configured to compare a phase of a clock delayed by the first set of the delay units with a phase of the reference clock to control the reference delay amount.

5. A clock generation circuit, comprising:
   a phase comparison unit configured to compare a phase of a delay clock with a phase of a reference clock to generate a comparison signal;
   a delay control unit configured to output a delay signal controlling a reference delay amount in response to the comparison signal;
   a voltage control delay unit configured to delay the reference clock by M times the reference delay amount in response to the delay signal; and
   an oscillation unit including series-connected N number of delay units through which delay amounts are respectively controlled in response to the delay signal, wherein an output signal of a last delay unit of the N number of delay units is inverted and inputted to a first delay unit of the N number of delay units.

6. The clock generation circuit of claim 5, wherein the output signal of the last delay unit oscillates at a frequency inversely proportional to the reference delay amount and the N number.

7. The clock generation circuit of claim 5, wherein the voltage control delay unit includes delay units, and each of the delay units of the oscillation circuit is identical in delay characteristic to the delay units of the voltage control delay unit.

8. The clock generation circuit of claim 5, wherein the reference delay amount is proportional to a period of the reference clock and inversely proportional to the M.

9. A clock generation circuit, comprising:
   a phase comparison unit configured to compare a phase of a delay clock with a phase of a reference clock to generate a comparison signal;
   a delay control unit configured to output a delay signal controlling a reference delay amount in response to the comparison signal;
   a voltage control delay unit configured to delay the reference clock by M times the reference delay amount in response to the delay signal, where M is an even number; and
   an oscillation circuit including N series-connected delay units through which the reference delay amounts are respectively controlled in response to the delay signal, wherein an output signal of a last delay unit of the N delay units is inverted and inputted to a first delay unit of the N delay units,
   wherein N is an odd number, and each of the delay units is configured to invert and output an input signal.

10. The clock generation circuit of claim 9, wherein the output signal of the last delay unit oscillates at a frequency inversely proportional to the reference delay amount and the number N.

11. The clock generation circuit of claim 9, wherein the voltage control delay unit includes delay units, and each of the delay units of the oscillation circuit is identical in delay characteristic to the delay units of the voltage control delay unit.

12. The clock generation circuit of claim 9, wherein the reference delay amount is proportional to a period of the reference clock and inversely proportional to M.

13. A clock generation circuit, comprising:
a delay lock circuit configured to delay a reference clock to generate M delay clocks, a delay between two consecutive clocks being equal to a reference delay amount; and
an oscillation circuit configured to generate an oscillation clock oscillating at a frequency inversely proportional to the reference delay amount,
wherein the oscillation clock is inverted and fed back to the oscillation circuit.

14. The clock generation circuit of claim 13, wherein the delay lock circuit includes:
a phase comparison unit configured to compare a phase of the Mth delay clock of the M delay clocks with a phase of the reference clock to generate a comparison signal;
a delay control unit configured to output a delay signal controlling the reference delay amount in response to the comparison signal; and
a voltage control delay unit including M delay units, each configured to delay the reference clock or an input signal of the delay unit by the reference delay amount to output a delay clock of the delay unit in response to the delay signal.

15. The clock generation circuit of claim 13, wherein the reference delay amount is proportional to a period of the reference clock and inversely proportional to M.

16. The clock generation circuit of claim 13, wherein the oscillation circuit includes N series-connected delay units through which the reference delay amounts are respectively controlled in response to the delay signal, an output signal of a last delay unit of the N delay units is inverted and inputted to a first delay unit of the N delay units, and the output signal of the last delay unit is the oscillation clock.

17. The clock generation circuit of claim 13, wherein the oscillation clock has a frequency inversely proportional to N.

18. The clock generation circuit of claim 13, wherein each delay unit of the oscillation circuit is identical in delay characteristic to the delay units of the voltage control delay unit.

* * * * *